(12) United States Patent
Deng

(10) Patent No.: US 6,650,133 B1
(45) Date of Patent: Nov. 18, 2003

(54) METHOD AND APPARATUS FOR BUCKLING BEAM TESTING

(75) Inventor: Charlie Deng, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 23 days.

(21) Appl. No.: 09/696,452

(22) Filed: Oct. 25, 2000

(51) Int. Cl.[7] ............................................... G01R 31/02
(52) U.S. Cl. ....................................... 324/761; 324/754
(58) Field of Search ................................. 324/754, 755, 324/761, 762; 439/482, 824, 66, 70, 92, 289

(56) References Cited

U.S. PATENT DOCUMENTS

| | | | | |
|---|---|---|---|---|
| 4,423,376 A | * | 12/1983 | Byrnes et al. | 324/754 |
| 4,686,464 A | | 8/1987 | Elsasser et al. | 324/158 |
| 4,721,903 A | * | 1/1988 | Harsch et al. | 324/149 |
| 4,901,013 A | | 2/1990 | Benedetto et al. | 324/158 |
| 5,248,262 A | * | 9/1993 | Busacco et al. | 439/493 |
| 5,367,254 A | * | 11/1994 | Faure et al. | 324/761 |
| 5,399,101 A | * | 3/1995 | Campbell et al. | 439/482 |
| 5,414,346 A | * | 5/1995 | Mohan | 324/761 |
| 5,488,314 A | | 1/1996 | Brandt et al. | 324/758 |
| 6,024,579 A | * | 2/2000 | Bennett | 439/289 |
| 6,224,396 B1 | * | 5/2001 | Chan et al. | 439/66 |

FOREIGN PATENT DOCUMENTS

JP    Hei 3-69131   *  3/1991

* cited by examiner

*Primary Examiner*—Vinh P. Nguyen
(74) *Attorney, Agent, or Firm*—Schwegman, Lundberg, Woessner & Kluth, P.A.

(57) ABSTRACT

A buckling beam testing assembly including a frame and one or more buckling beam wires coupled to the frame, each wire having a main body having a first end couplable to a testing apparatus and a second end having a cross-sectional area, each wire having a tip for piercing or penetrating a contact point of a device being tested. Each tip has a base portion attached to the second end of the main body, wherein the base of each tip has a cross-sectional area smaller than the cross-sectional area of the second end.

27 Claims, 4 Drawing Sheets

METHOD AND APPARATUS FOR BUCKLING BEAM TESTING

FIELD

This invention relates to the field of test probing, and more specifically to buckling beam test probing.

BACKGROUND

As circuits, such as integrated circuits on semiconductor chips, become increasingly complex, it is becoming more important to test the circuits for any errors. However, as the circuits become more and more dense (have more contact points), it is also becoming increasingly harder to perform the tests.

One method of testing circuits is called buckling beam probing. Buckling beams are conductive wires which are connected to a testing apparatus and which are used as contact probes. In one buckling beam probing assembly, a large number of buckling beams are arranged in a frame which includes guide plates which are drilled according to the footprint of contact points of the circuit being tested. The ends of the buckling beams are brought into contact with the contact points of the device being tested and put under an axial stress which causes the beams to deflect or buckle laterally. The lateral buckling helps the probe assembly adapt to irregularities in the surface of the device being tested and to adapt to different heights of the contact pads or points. Some buckling beams include a pointed tip to help penetrate any oxide buildup on the contact being probed.

Present buckling beam assemblies can be improved. One problem is that due to the variations in probing over-travel and/or contact point height, a probing process can induce a shearing force in the contact point, especially when pointed tip buckling beams are used. This can cause either reliability problems or permanent damage of the intended contact.

DETAILED DESCRIPTION

In the following detailed description, reference is made to the accompanying drawings that form a part hereof, and in which are shown by way of illustration specific examples in which various embodiments of the invention may be practiced. It is understood that other embodiments may be utilized and structural changes may be made without departing from the scope of the present invention.

In the present description "vertical," "horizontal," "up," "down," "first," "second," and the like are meant to be taken in their relative sense in regards to the position of the figures and the context of the description, and they are not to be taken in their absolute sense.

Figure 1:
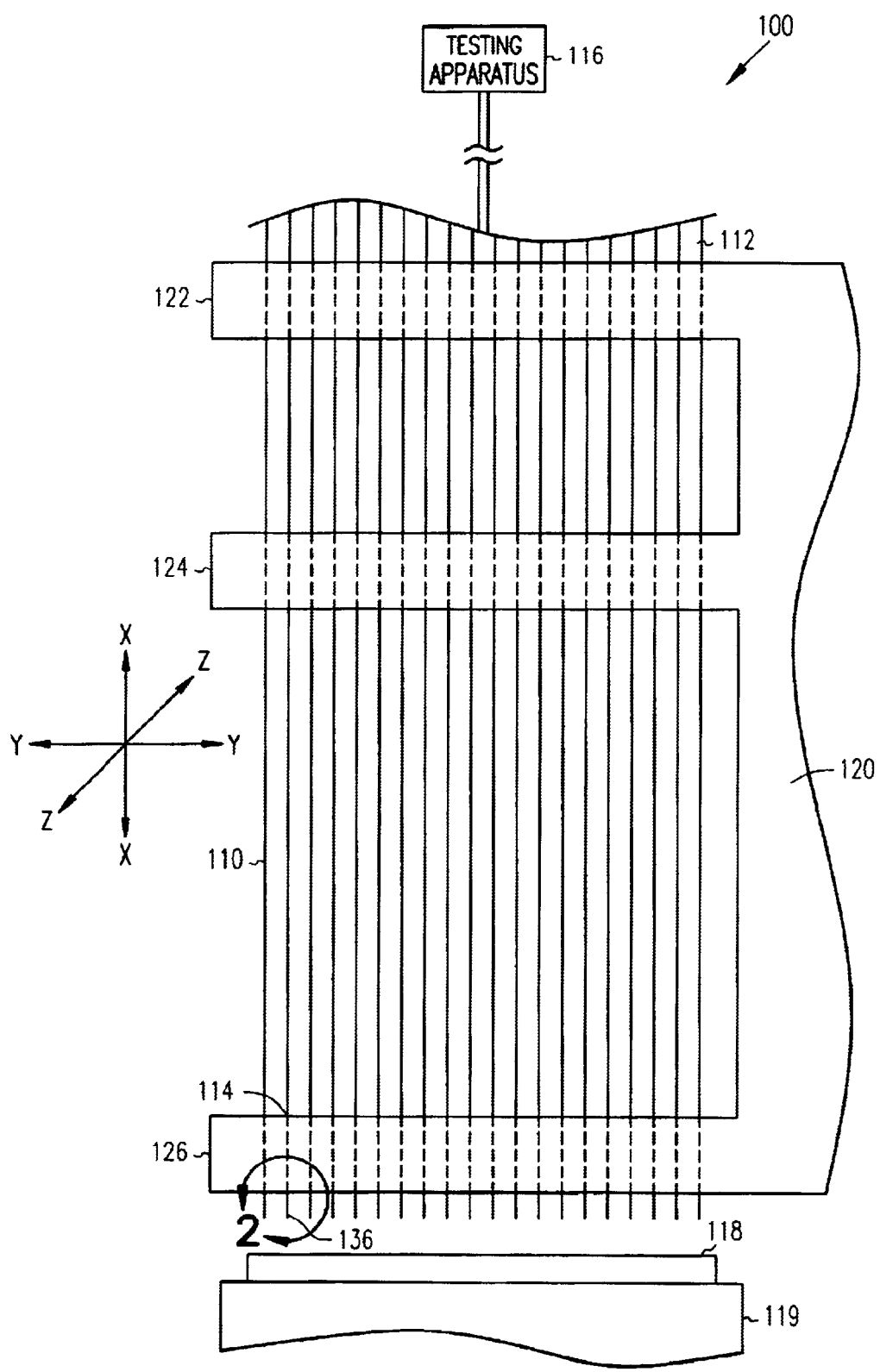
FIG. 1 shows a partial cross-sectional view of a buckling beam testing assembly in accord with one embodiment of the present invention.

FIG. 1 shows a partial view of a system 10 for buckling beam testing. System 10 includes a buckling beam testing assembly 100, a testing apparatus 116, and a holder 119 for holding a device 118 under testing. As used in this description, testing includes any sensing, monitoring, analyzing, or other probing or investigation of a circuit device. In this embodiment, testing apparatus 116 includes circuitry, software, and/or sensors or monitoring equipment for performing analysis of device 118. Device 118 can include an integrated circuit, a semiconductor, or other circuit device. Device 118 includes a plurality of contact points or contact pads (not shown) arranged in a pattern on a substrate.

Buckling beam testing assembly 100 includes a plurality of buckling beams 110 and a frame 120. Testing assembly 100 is communicatively coupled to testing apparatus 116, which can be separate from the testing assembly or attached thereto.

In one embodiment, each buckling beam 110 is an elongated, flexible, electrically conductive wire having a first end 112 which is operatively coupled to testing apparatus 116 and a second end 114 which includes a tip 136 for contacting and/or piercing one or more of the contact points on device 118. Each of the buckling beams 110 of assembly 100 is essentially parallel with the other buckling beams and positioned to contact one or more of the contact points. Typically, the buckling beams are arranged in a matrix pattern which matches the pattern of the contact points of device 118. Alternatively, they are arranged in a manner necessary to match selected contact points on device 118.

In one embodiment, frame 120 includes a first guide plate 122, a second guide plate 124, and a third guide plate 126. It is noted that other conventional frames and guide plates are known in the art and are within the scope of various embodiments of the present invention. Accordingly, the number, arrangement, and types of guide plates can be varied according to other design considerations, such as the desired height of buckling beams 110 or the amount of pre-bow desired, as will be discussed below. In this embodiment, each of the buckling beams 110 is attached or mounted to first guide plate 122 and is slidable within through-holes or vias in guide plates 124 and 126. The through-holes form an array that corresponds to the array or pattern of test points or contact points of device 118.

In this embodiment, each of the guide plates are coupled together by frame 120. Frame 120 is a spacer means that serves to maintain the guide plates spaced apart from, and in fixed relationship with, each other. In one embodiment, a portion of each buckling beam 110 is located below the bottom guide plate 126. Thus, when frame 120 is moved downward or holder 119 is moved upward, the tip 136 on the end 114 of each buckling beam 110 comes in contact with device 118. In some embodiments, the buckling beams 110 are located so that the tips are partially or totally within guide plate 126, which is slidably coupled to frame 120 so that when guide plate 126 is forced against device 118, the guide plate slides upwardly and the tips 136 of the buckling beams 110 can contact the contact points of the device being tested.

System 10 also includes a driving or actuation means 129 for providing axial force and a relatively moving frame 120 and holder 119 towards each other so that one or more buckling beams 110 contact one or more of the contact points of device 118. The driving means 129 can be connected to either or both the frame 120 or the holder 119.

When a buckling beam 110 comes in contact with contact points on device 118, an opposing axial force in the x-direction is applied to buckling beam 110. This axial force opposes the axial force of the driving means. When the axial force reaches a high enough level, each buckling beam 110 deflects or buckles laterally in the y-direction or the z-direction. In some embodiments, guide plate 124 is off-set to provide a pre-bend or pre-bow in each buckling beam 110, so that the wires deflect consistently and at a proper predetermined x-direction force level. In some embodiments, other preloading means for ensuring that the buckling beams 110 bend predictably in a predetermined direction is provided. Some embodiments omit one or more of guide plates 122, 124, and/or 126.

Figure 2:
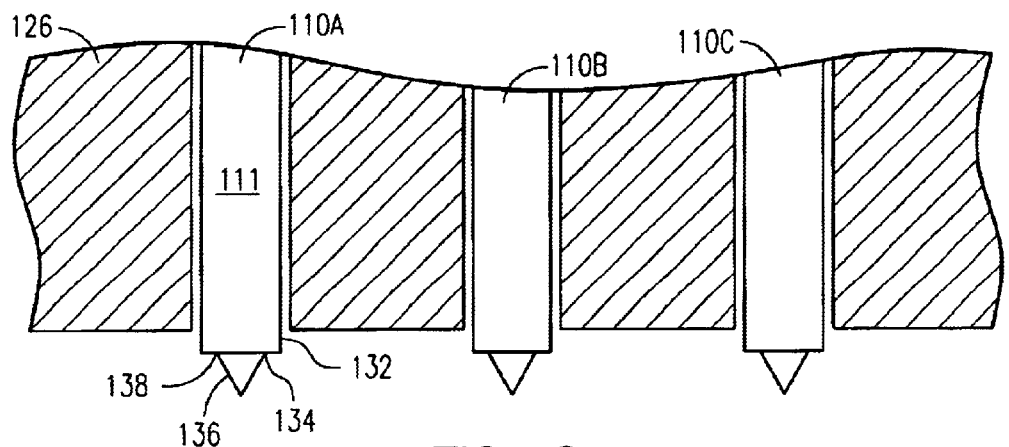
FIG. 2 shows an enlarged view of the buckling beams of FIG. 1.

FIG. 2 shows an enlarged view of a portion of FIG. 1, showing portions of buckling beams 110a–110c. Each buckling beam 110a–110c includes a main body portion 111 having a lower end 132 which terminates at a lower edge of the main body. Lower end 132 has a cross-sectional area at the lower edge. A decrease in cross-sectional area of end 132 defines a shoulder or stopper section 134. In this embodiment, shoulder section 134 is a substantially planar surface which lies perpendicular to the axial direction of buckling beam 110a–110c. In other embodiments, shoulder section 134 can have a slope to it, and/or it can include bumps or other textured surface. Some embodiments include two or more shoulders and thus present a stair-shaped pattern.

At the end of buckling beams 110a–110c is probe tip 136 which is for contacting and/or piercing a contact point on an electrical circuit. In this embodiment, tip 136 is cone-shaped up to a tip base area 138 where it meets a bottom surface of lower end 132. From that point, shoulder 134 laterally projects from the base of the tip. In this embodiment, the cross-sectional area of tip base area 138 is smaller than the cross-sectional area of lower end 132, thus defining shoulder or stopper portion 134.

In this embodiment, each tip 136 includes a point-shaped or cone-shaped end. As will be discussed below, other embodiments include other shapes.

Figure 3A:
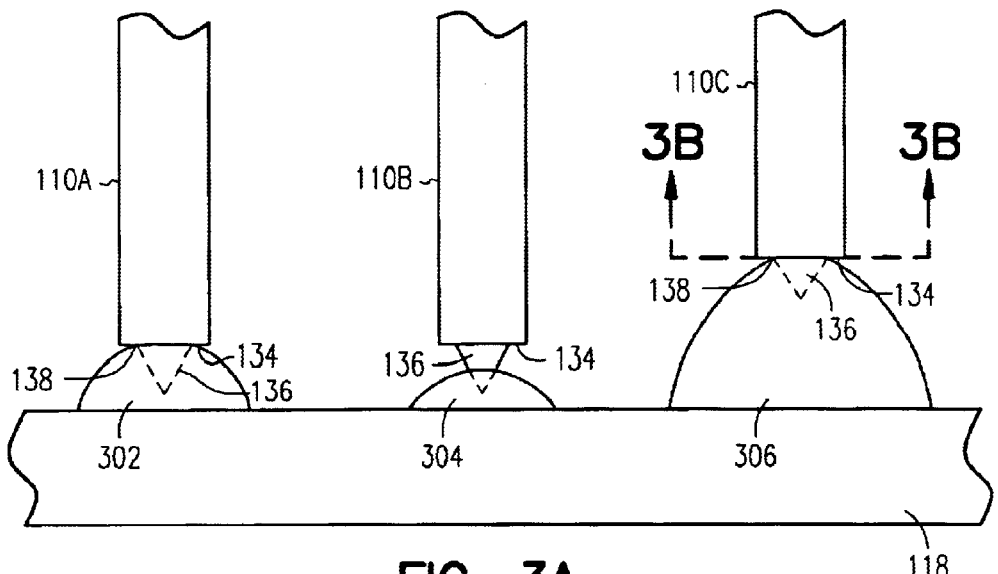
FIG. 3A shows the buckling beams of FIG. 1 during an exemplary testing process.

FIG. 3A shows buckling beams 110a–110c during an exemplary testing process. Exemplary device 118 includes three contact points 302, 304, and 306. As can be seen, the relative heights of the contact points are all different. When the buckling beams 110a–110c have an axial force applied to them, they each contact a contact point 302, 304, and 306, respectively. Each buckling beam tip 136 can penetrate or pierce each contact point up to shoulder 134. The contact point then applies an opposing axial force on the buckling beam via the shoulder which causes the buckling beam to deflect or buckle.

Thus, in the example of FIG. 3, buckling beam 110c has a buckling force applied on it. Shoulder 134 prevents the buckling beam from entering too deeply into contact point 306 and causing damage to the contact point. The height of a tip or the location of a shoulder can be varied depending on how deep a designer wants the beam to probe the contact. In one embodiment, by way of example, the tip has a height of approximately 10 microns. In other embodiments, the tip has a height of less than approximately 5 microns, a height of approximately 5 microns, a height of approximately 5 to approximately 10 microns, and a height of greater then approximately 10 microns.

Figure 3B:
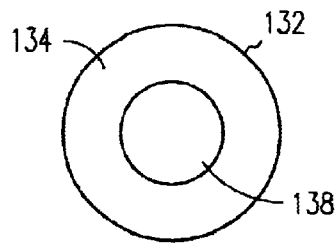
FIG. 3B shows a cross-section view of one of the buckling beams of FIG. 3A.

FIG. 3B shows a cross-section view of buckling beam 110c along line 3B—3B of FIG. 3A. FIG. 3B shows an example of the difference between the cross-sectional areas of tip base area 138 and lower end 132 according to one embodiment. By taking advantage of the cross-section of the buckling beam as a stopper or shoulder 134, the buckling beam is prevented from probing deep into the material which can help prevent a tear of the material under probing.

In one embodiment, the probe tips 136 are pointed or cone-shaped to allow for self-cleaning during the probing process. The pointed tip allows the tip to wipe itself clean as it is removed from the contact material. Thus, the present embodiment provides both a self-cleaning tip and one which does not harm the integrity of the contact material being probed. In various embodiments, the probe tip includes different shapes, such as blade-shaped, pyramid-shaped, or other desirable shape.

In one embodiment, the tip and buckling beam are manufactured as a unitary structure. In one embodiment, the tip is formed by a grinding process. In one embodiment, the tip is formed by a chemical etching process. In another embodiment, the tip may be formed separately and attached to the end of the buckling beam.

Figure 4:
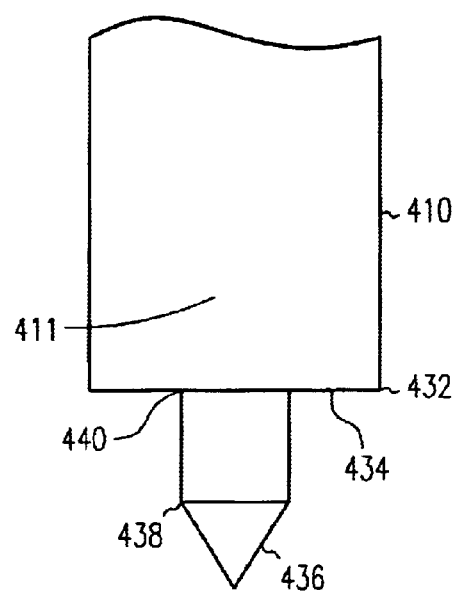
FIG. 4 shows a side view of a buckling beam in accord with another embodiment of the present invention.

FIG. 4 shows a side view of a buckling beam 410 in accord with another embodiment of the present invention. Buckling beam 410 includes a main body portion 411 having an end 432 which has a cross-sectional area at a lower end thereof. At end 432, buckling beam 410 has a decrease in cross-sectional area which defines a shoulder or stopper section 434. In this embodiment, shoulder portion 434 is a substantially planar surface which lies perpendicular to the axial direction of buckling beam 410. In other embodiments, shoulder portion 434 can have a gradual slope to it, and it can include bumps or other textured surface. Some embodiments include two or more shoulders 434 and thus present a stair-shaped pattern.

Buckling beam 410 includes a probe tip 436 for contacting and/or piercing a contact point on an electrical circuit. In this embodiment, probe tip 436 is cone-shaped up to a first base area 438. The tip is then cylindrical-shaped up to a second base section 440 where the tip meets the bottom surface of end 432 and laterally projecting shoulder section 434. In this embodiment, the cross-sectional area of second tip base 440 is smaller than the cross-sectional area of end 432, thus providing or defining shoulder section 434. In this embodiment, tip 436 is generally centered on the end face of the main body 411. Alternatively, the tip may be off-set, as will be discussed below.

Figure 5:
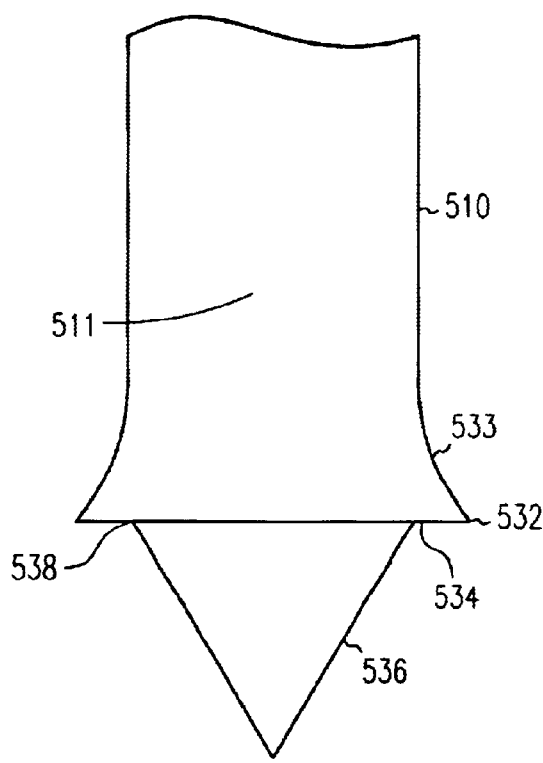
FIG. 5 shows a side view of a buckling beam in accord with another embodiment of the present invention.

FIG. 5 shows a side view of a buckling beam 510 in accord with one embodiment. Buckling beam 510 includes a main body portion 511 having an end 532 which has a cross-sectional area at a lower end thereof. At end 532, the buckling beam has an increase and then a decrease in cross-sectional area which defines a flange 533. At the lower edge of lower end 532, flange 533 defines a shoulder or stopper section 534 under the flange. In this embodiment, shoulder portion 534 is a substantially planar surface which lies perpendicular to the axial direction of buckling beam 510. In other embodiments, shoulder portion 534 can have a gradual slope to it, and it can include bumps or other textured surface. Some embodiments include two or more shoulders, such as shoulder 534, and thus present a stair-shaped pattern.

Buckling beam 510 includes a probe tip 536 for contacting and/or piercing a contact point on an electrical circuit. In this embodiment, probe tip 536 is cone-shaped up to a tip base area 538 where it meets the bottom surface of lower end 532 and laterally projecting shoulder section 534 under flange 533. In this embodiment, the cross-sectional area of tip base 538 is smaller than the cross-sectional area of lower end 532, thus providing shoulder section 534.

Figure 6A:
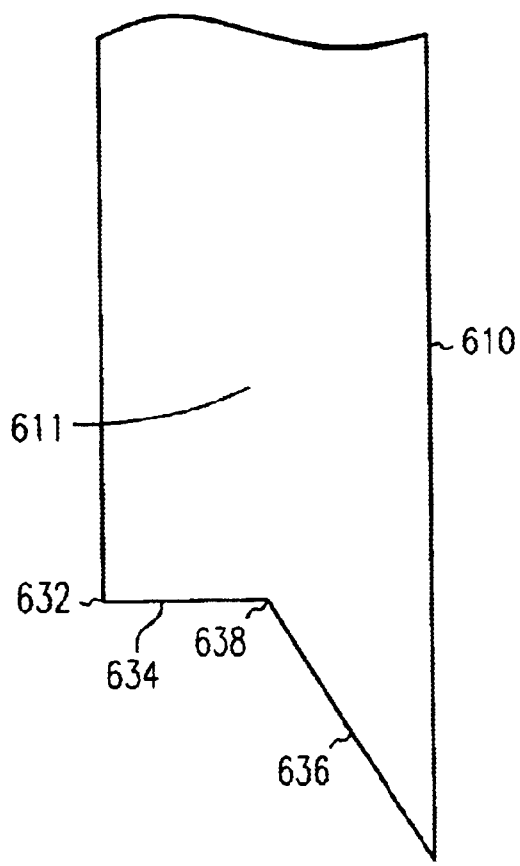
FIG. 6A shows a side view of a buckling beam in accord with another embodiment of the present invention.
Figure 6B:
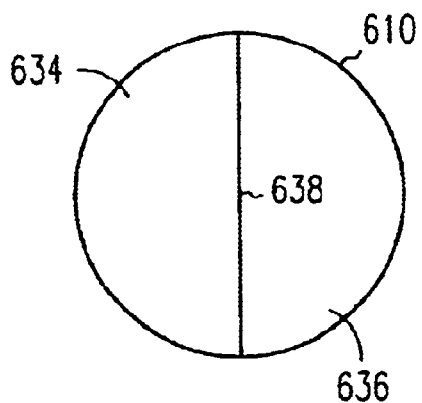
FIG. 6B shows a bottom view of the buckling beam of FIG. 6A.

FIGS. 6A and 6B show a side view and a bottom view, respectively, of a buckling beam 610 in accord with another embodiment of the present invention. Buckling beam 610 includes a main body portion 611 having an end 632 which has a cross-sectional area at a lower end thereof. At end 632, buckling beam 610 has a decrease in cross-sectional area which defines a shoulder or stopper section 634. In this embodiment, shoulder portion 634 is a substantially planar surface which lies perpendicular to the axial direction of buckling beam 610. In other embodiments, shoulder portion 634 can have a gradual slope to it, and it can include bumps or other texture. Some embodiments include two or more shoulders such as shoulder 634 and thus present a stair-shaped pattern.

Buckling beam 610 includes a probe tip 636 for contacting and/or piercing a contact point on an electrical circuit. In this embodiment, tip 636 is angled up to a base area 638 where it meets the bottom surface of lower end 632 and laterally projecting shoulder section 634. In this embodiment, the cross-sectional area of second tip base 638 is smaller than the cross-sectional area of the bottom surface of lower end 632, thus providing shoulder section 634. In this embodiment, tip 636 is not centered on the bottom of main body 611.

CONCLUSION

For the reasons stated above, and for other reasons which are now apparent to those skilled in the art upon reading the present specification, there is a need for a testing process and apparatus which allows for protecting the integrity of a material under probing. In one embodiment, a buckling beam is provided having means for preventing a buckling beam from probing into the material further than a predetermined distance. One aspect provides a buckling beam testing assembly including a frame and one or more buckling beam wires coupled to the frame, each wire having a main body having a first end couplable to a testing apparatus and a second end having a cross-sectional area, each wire having a tip having a base portion attached to the second end of the main body, wherein the base of each tip has a cross-sectional area smaller than the cross-sectional area of the second end. By taking advantage of the cross-section of the buckling beam as a stopper, the probe is prevented from probing deep into the material.

It is understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A testing assembly comprising:
   a frame; and
   one or more elongated wires coupled to the frame, each wire having a main body having a first end couplable to a testing apparatus and a second end having a single tip for contacting a contact point, each single tip having a base portion attached to the second end of the main body, wherein the base of each tip has a cross-sectional area smaller than a cross-sectional area of the second end such that a shoulder is defined at the second end, wherein the shoulder limits a depth that the tip can penetrate the contact point.

2. The testing assembly of claim 1, wherein the tip comprises a cone-shaped member.

3. The testing assembly of claim 1, wherein the tip comprises a blade-shaped member.

4. The testing assembly of claim 1, wherein the tip comprises a pyramid-shaped member.

5. The testing assembly of claim 1, wherein the second end of the main body comprises a flange portion.

6. The testing assembly of claim 1, wherein the second end of the main body includes a shoulder projecting from the base of the tip.

7. The testing assembly of claim 6, wherein the shoulder has a surface which is substantially perpendicular to an axial direction of the main body.

8. The testing assembly of claim 1, wherein the tip is substantially centered on the second end of the main body.

9. The testing assembly of claim 1, wherein the tip is off-set from a center of the second end of the main body.

10. A buckling beam for a buckling beam testing assembly, the buckling beam comprising:
    an electrically conductive and bendable elongated wire body having a first end couplable to a testing apparatus and having a second end having a tip extending from the second end in alignment with the elongated wire body, the tip for contacting or penetrating a contact point of a device being tested;
    wherein said second end includes a shoulder located near the tip for limiting a depth the tip can penetrate said contact point if the tip penetrates the contact point.

11. The buckling beam of claim 10, wherein the tip includes a base section connected to the second end, and wherein the shoulder laterally projects from the base section.

12. The buckling beam of claim 10, wherein the shoulder comprises a surface area of the second end of the main body which is not covered by a base section of the tip.

13. The buckling beam of claim 10, wherein the second end has a cross-sectional area and the tip has a base having a cross-sectional area, the base cross-section is smaller than the cross-sectional area of the second end.

14. The buckling beam of claim 10, wherein the tip comprises a blade-shaped member.

15. The buckling beam of claim 10, wherein the tip comprises a pyramid-shaped member.

16. The buckling beam of claim 10, wherein the tip is shaped to provide self-cleaning of the tip.

17. A testing assembly for testing a circuit having a plurality of contact points, the testing assembly comprising:
    a frame;
    a plurality of elongated wire buckling beams carried by the frame, each buckling beam having a first end couplable to a testing apparatus and having a second end including a tip extending from the second end in alignment with the elongated wire, the tip for contacting or piercing one or more of the plurality of contact points; and
    means for limiting a distance the second end of each buckling beam can penetrate a contact point if the second end pierces the contact point.

18. The testing assembly of claim 17, wherein the plurality of buckling beams are arranged in a pattern matching a pattern of the plurality of contact points.

19. The testing assembly of claim 17, wherein each buckling beam deflects in a lateral direction when the buckling beam has reached its penetration limit.

20. The testing assembly of claim 17, wherein means for limiting comprises a shoulder section on each buckling beam wherein an axial force is applied on the shoulder section by the contact point when the buckling beam has reached its penetration limit.

21. The testing assembly of claim 17, wherein each tip includes a base section having a cross-sectional area smaller than a cross-sectional area of a portion of the second end that the tip base is connected to.

22. A system for testing a circuit having one or more test contact points arranged in a pattern, the system comprising:

a holder for holding the circuit;

a testing apparatus for analyzing the circuit;

a frame having one or more guide plates, each guide plate having one or more through-holes which substantially match the pattern of the one or more test contact points of the circuit;

one or more buckling beam members attached to the frame and located within one or more of the through-holes; and means for moving the frame and the holder closer to each other wherein the one or more buckling beams contact one or more of the contact points;

said one or more buckling beams each comprising an elongated, electrically conductive wire, each buckling beam having a first end operatively coupled to the testing apparatus and having a second end for contacting one or more of the test contact points, the second end having a tip and also having a shoulder portion located above the tip.

23. The system of claim 22, wherein the shoulder portion comprises an end surface of the second end of the buckling beam which is not covered by the tip.

24. The system of claim 23, wherein the tip includes a base portion located against the end surface of the second end, the tip base having a cross-sectional area smaller than the cross-sectional area of the second end of the buckling beam.

25. A method of buckling beam testing of a circuit having a contact point, the method comprising:

moving an end of a buckling beam wire towards a contact point in a direction parallel to an axis of the buckling beam wire to effect contact or penetration of the contact point by the end of the buckling beam wire; and providing a shoulder near a tip of the buckling beam wire to limit a depth of penetration of the wire if the buckling beam wire reaches a predetermined depth in the contact point.

26. The method of claim 25, wherein the buckling beam deflects in a lateral direction when the buckling beam has reached the predetermined depth.

27. The method of claim 25, wherein applying the second, opposing axial force on the buckling beam comprises applying the opposing axial force on a shoulder section of the buckling beam by the contact point when the buckling beam has reached the predetermined depth in the contact point.

* * * * *

UNITED STATES PATENT AND TRADEMARK OFFICE
CERTIFICATE OF CORRECTION

PATENT NO. : 6,650,133 B1
DATED : November 18, 2003
INVENTOR(S) : Deng

It is certified that error appears in the above-identified patent and that said Letters Patent is hereby corrected as shown below:

<u>Title page, Item [54] and Column 1, lines 1-2,</u>
Title, delete "METHOD AND APPARATUS FOR BUCKLING BEAM TESTING" and insert -- BUCKLING BEAM PROBE ASSEMBLY --, therefor.

Signed and Sealed this

Eleventh Day of May, 2004

JON W. DUDAS
*Acting Director of the United States Patent and Trademark Office*